(12) United States Patent
Uezato

(10) Patent No.: US 10,607,916 B2
(45) Date of Patent: Mar. 31, 2020

(54) SUBSTRATE FOR SEMICONDUCTOR DEVICES

(71) Applicant: FUJI ELECTRIC CO., LTD., Kanagawa (JP)

(72) Inventor: Yoshinori Uezato, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 324 days.

(21) Appl. No.: 15/418,786

(22) Filed: Jan. 30, 2017

(65) Prior Publication Data

US 2017/0271236 A1    Sep. 21, 2017

(30) Foreign Application Priority Data

Mar. 17, 2016 (JP) .................................. 2016-054361

(51) Int. Cl.
| | |
|---|---|
| *H01L 21/02* | (2006.01) |
| *H01L 23/373* | (2006.01) |
| *H01L 23/00* | (2006.01) |
| *H01L 25/07* | (2006.01) |

(52) U.S. Cl.
CPC .......... *H01L 23/3735* (2013.01); *H01L 24/29* (2013.01); *H01L 24/32* (2013.01); *H01L 25/072* (2013.01); *H01L 2224/291* (2013.01); *H01L 2224/32225* (2013.01); *H01L 2924/13055* (2013.01); *H01L 2924/3512* (2013.01); *H01L 2924/37001* (2013.01)

(58) Field of Classification Search
CPC ............. H01L 21/4882; H01L 23/3735; H01L 2224/291; H01L 2224/32225; H01L 24/29; H01L 24/32; H01L 25/072; H01L 2924/13055; H01L 2924/3512; H01L 2924/37001

See application file for complete search history.

(56) References Cited

U.S. PATENT DOCUMENTS

| | | | | | |
|---|---|---|---|---|---|
| 5,055,378 | A | * | 10/1991 | Miyamura ........... | C08F 299/022 430/280.1 |
| 2014/0048918 | A1 | * | 2/2014 | Nagaune ............. | H01L 23/4334 257/675 |

FOREIGN PATENT DOCUMENTS

| | | |
|---|---|---|
| JP | 2000349209 A | 12/2000 |
| JP | 2001177053 A | 6/2001 |
| JP | 2011100864 A | 5/2011 |

OTHER PUBLICATIONS

Office Action issued for counterpart Japanese Application No. 2016-054361, issued by the Japanese Patent Office dated Jan. 7, 2020 (drafted Dec. 23, 2019).

* cited by examiner

*Primary Examiner* — Travis M Figg

(57) ABSTRACT

Provided is a substrate for semiconductor devices comprising: an insulating substrate; and a first metal board having a plurality of sides and formed on a first surface of the insulating substrate; wherein the first metal board includes: a corner portion positioned closer to a corner of a first side of the first metal board, for which a creepage distance between an edge of the first metal board and an edge of the insulating substrate reaches a smallest value for the first side; and a center portion positioned closer to a center of the first side than the corner portion, for which a creepage distance between the edge of the first metal board and the edge of the insulating substrate exceeds the smallest value; wherein a range of the center portion is larger than a range of the corner portion.

17 Claims, 13 Drawing Sheets

A-A'

B-B'

SUBSTRATE FOR SEMICONDUCTOR DEVICES

BACKGROUND

1. Technical Field

The present invention relates to a substrate for semiconductor devices.

2. Related Art

Conventionally, in the field of a substrate for semiconductor devices on which a semiconductor device is placed, it has been known to form a metal board below the substrate for semiconductor devices and solder it to a heat releasing board (refer to WO 2012/157584 and Japanese Patent Application Publication No. 2001-177053, for example).

However, for a conventional substrate for semiconductor devices, a heat stress generated in the substrate for semiconductor devices and the heat releasing board may cause a solder to overflow from an insulating substrate. The solder overflow from the insulating substrate reduces insulation properties.

SUMMARY

In a first aspect of the present invention, a substrate for semiconductor devices comprises: an insulating substrate; and a first metal board having a plurality of sides and formed on a first surface of the insulating substrate. The first metal board may include: a corner portion positioned closer to a corner of a first side of the first metal board, for which a creepage distance between an edge of the first metal board and an edge of the insulating substrate reaches a smallest value for the first side; and a center portion positioned closer to a center of the first side than the corner portion, for which a creepage distance between the edge of the first metal board and the edge of the insulating substrate exceeds the smallest value. Also, a range of the center portion may be larger than a range of the corner portion.

The substrate for semiconductor devices may further comprise a second metal board formed on a second surface opposite to the first surface of the insulating substrate. Also, the second metal board may have a smaller volume than the first metal board.

The second metal board may have the same film thickness as that of the first metal board.

The range of the center portion may be 1.3 times or more the range of the corner portion.

The range of the corner portion may be 30% or less of a shortest side of the first metal board in length.

The range of the corner portion may be 10% or more of a shortest side of the first metal board in length.

The first metal board may have a rectangular shape. The center portion of a longer side of the first metal board may be larger than the center portion of a shorter side of the first metal board.

The range of the corner portion on the longer side of the first metal board may be equal to the range of the corner portion on the shorter side of the first metal board.

The creepage distance for the center portion may be 1.5 times or more and 2.5 times or less the creepage distance for the corner portion.

A substrate 100 for semiconductor devices may comprise: a plurality of the insulating substrates; a plurality of the first metal boards arranged to correspond to the plurality of insulating substrates; and a heat releasing board of a rectangular shape on which the plurality of insulating substrates are placed via the plurality of first metal boards.

The plurality of first metal boards may include: an inner side around which the plurality of first metal boards are opposing to one another; and an outer side around which the plurality of first metal boards are not opposing to one another. The outer side may be formed to be parallel to a longer side of the heat releasing board.

The first metal board may include: the corner portion corresponding to the inner side; and the center portion corresponding to the inner side.

The substrate for semiconductor devices may comprise a soldered portion formed on a surface of the heat releasing board in a surrounding area of the first metal board. At least a portion of the soldered portion may be formed below the insulating substrate in a planar view.

The soldered portion corresponding to the center portion may be formed more inside of the first metal board than the soldered portion corresponding to the corner portion.

The soldered portion corresponding to the center portion may be formed not sequentially with the soldered portion corresponding to the edge.

The soldered portion may be a carbon scribe or an organic resist formed on the surface of the heat releasing board.

The soldered portion corresponding to the center portion may be a carbon scribe formed on the surface of the heat releasing board, and the soldered portion corresponding to the corner portion is an organic resist formed on the surface of the heat releasing board.

The summary clause does not necessarily describe all necessary features of the embodiments of the present invention. The present invention may also be a sub-combination of the features described above.

DESCRIPTION OF THE EMBODIMENTS

Hereinafter, the present invention will be described through the embodiments of the invention. However, the embodiments described below are not to limit the claimed inventions. Also, all of the combinations of the features described in the embodiments are not necessary for means for solving the problem of the invention.

Figure 1:
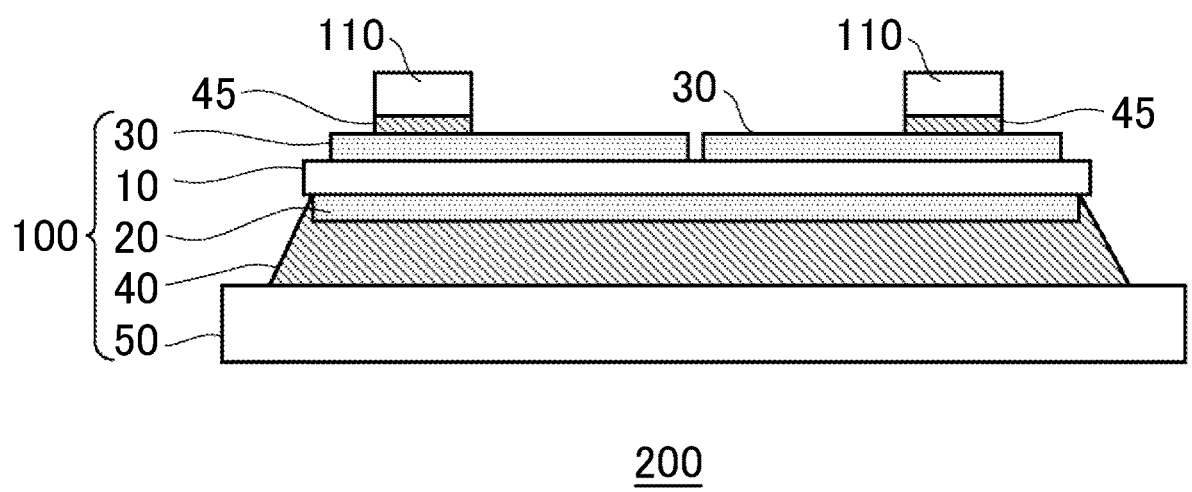
FIG. 1 illustrates an exemplary configuration of a semiconductor device 200.

FIG. 1 illustrates an exemplary configuration of a semiconductor device 200. The semiconductor device 200 comprises a substrate 100 for semiconductor devices and a semiconductor chip 110.

As used herein, the X direction and the Y direction are directions vertical to each other while the Z direction is a direction vertical to the X-Y plane. The X direction, the Y direction and the Z direction form a so called right handed system. The substrate for semiconductor devices of the present example has a front surface in the +Z direction and a back surface in the −Z direction. Note that the terms "on" and "above" mean the +Z direction. In contrast, the terms "under" and "below" mean the −Z direction.

In one example, the semiconductor chip 110 is an insulated gate bipolar transistor (IGBT). Also, the semiconductor chip 110 may be a reverse-conducting IGBT (RC-IGBT). For example, the semiconductor chip 110 includes three units of two RC-IGBTs to configure a three phase inverter with the six RC-IGBTs.

The substrate 100 for semiconductor devices comprises an insulating substrate 10, a first metal board 20, a second metal board 30, a solder 40 and a heat releasing board 50. The semiconductor chip 110 is arranged above the substrate 100 for semiconductor devices using the solder 45.

The insulating substrate 10 is an insulative substrate having surfaces parallel to the X-Y plane. For example, the insulating substrate 10 is a ceramic substrate containing at least one of alumina, aluminum nitride and silicon nitride. Preferably, the insulating substrate 10 is formed of a material of high heat conductivity. In one example, the insulating substrate 10 has a film thickness of 0.25 mm to 0.38 mm.

The first metal board 20 is formed on either one of the surfaces of the insulating substrate 10. The first metal board 20 includes a plurality of sides. That is, the first metal board 20 has a predetermined polygon shape. The first metal board 20 of the present example is formed on a surface of the insulating substrate 10 positioned at a negative side of the Z axis. The first metal board 20 receives a heat generated by the semiconductor chip 110 through the insulating substrate 10 and emits the heat through its surface. For example, the first metal board 20 is formed of copper. The first metal board 20 may have a film thickness of 0.20 mm to 0.4 mm.

The second metal board 30 is formed on a surface of the insulating substrate 10 opposite to the first metal board 20. The second metal board 30 of the present example is formed on a surface of the insulating substrate 10 positioned at a positive side of the Z axis. The second metal board 30 includes a predetermined circuit formed thereon depending on a structure of the semiconductor chip 110. The second metal board 30 may be connected to an external terminal electrically connected to outside of the substrate 100 for semiconductor devices. The substrate 100 for semiconductor devices of the present example has a structure in which the first metal board 20 and the second metal board 30 are affixed to both surfaces of the insulating substrate 10, respectively. For example, the second metal board 30 is formed of copper. The insulating substrate 10, the first metal board 20 and the second metal board 30 may be affixed by way of direct joint or braze joint. The second metal board 30 may have a film thickness of 0.20 mm to 0.4 mm. In one example, the second metal board 30 is formed to have the same film thickness as the film thickness of the first metal board 20. However, preferably, the second metal board 30 has a smaller volume, than the volume of the first metal board 20.

The solder 40 is provided between the first metal board 20 and the heat releasing board 50. The solder 40 is joined such that the heat resistance between the insulating substrate 10 and the heat releasing board 50 is reduced.

The heat releasing board 50 receives a heat generated by the semiconductor chip 110 and emits the heat towards the opposite side. The heat releasing board 50 is formed of, for example, a metal of high heat conductivity. In one example, the material of the heat releasing board 50 includes copper and copper alloy.

Example 1

Figure 2A:
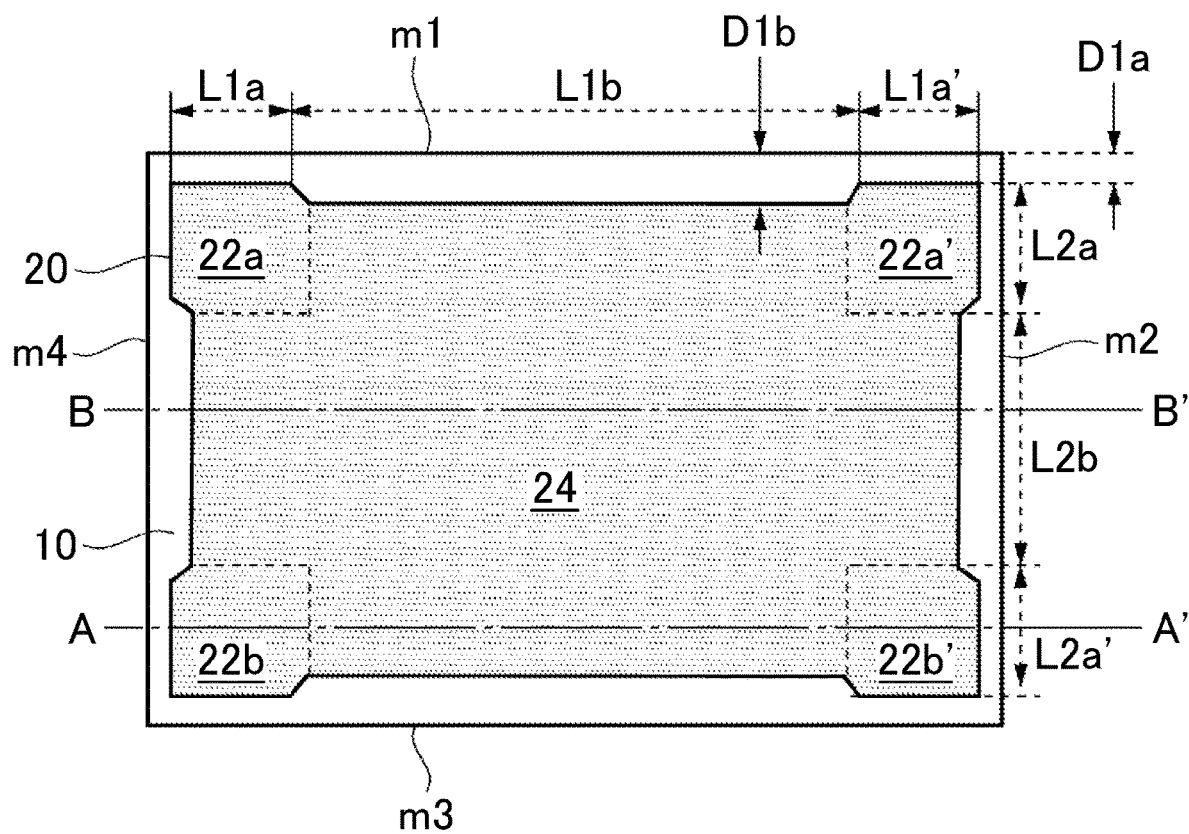
FIG. 2A illustrates an exemplary plan view of an insulative substrate in accordance with Example 1.
Figure 2B:
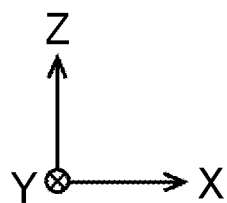
FIG. 2B illustrates an exemplary cross-sectional view taken along A-A' of the insulative substrate in accordance with Example 1.
Figure 2B:
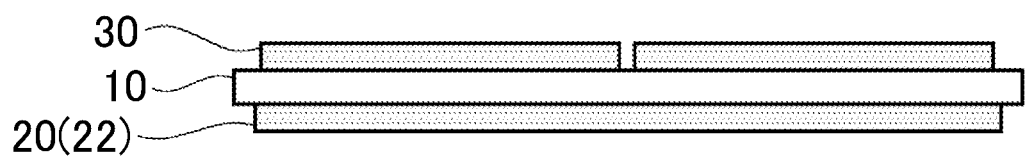
Figure 2C:
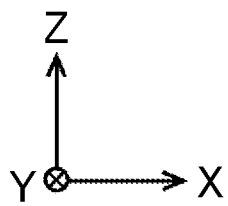
FIG. 2C illustrates an exemplary cross-sectional view taken along B-B' of a substrate 100 for semiconductor devices in accordance with Example 1.
Figure 2C:
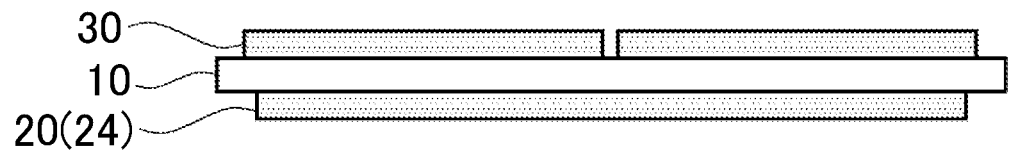

FIG. 2A illustrates an exemplary plan view of an insulative substrate in accordance with Example 1. FIG. 2B illustrates an exemplary cross-sectional view taken along A-A' of the insulative substrate in accordance with Example 1. FIG. 2C illustrates an exemplary cross-sectional view taken along B-B' of a substrate 100 for semiconductor devices in accordance with Example 1. Note that FIG. 2A is viewed from a negative side of the Z axis to illustrate the shape of the first metal board 20.

The insulating substrate 10 has a rectangular shape in a planar view. The insulating substrate 10 of the present example includes a first side m1, a second side m2, a third side m3 and a fourth side m4. The first side m1 and the third side m3 correspond to longer sides. The second side m2 and the fourth side m4 correspond to shorter sides of the rectangular shape.

The first metal board 20 has a polygon shape in a planar view. Although the first metal board 20 of the present example has a rectangular shape, it may have a square shape or other shapes. The first metal board 20 includes a corner portion 22 and a center portion 24. The corner portion 22 and the center portion 24 are differentiated by a creepage distance. As used herein, the creepage distance refers to a distance between an edge of the first metal board 20 and an edge of the insulating substrate 10.

The corner portion 22 is positioned closer to a corner of the first side m1 of the first metal board 20. The corner portion 22 is a portion for which the creepage distance between the edge of the first metal board 20 and the edge of the insulating substrate 10 reaches the smallest value for the first side m1. If the insulating substrate 10 has a rectangular shape, the first metal board 20 includes four corner portions 22a, 22a', 22b, and 22b'. The corner portion 22a is formed closer to a corner at which the first side m1 and the fourth side m4 intersect. The corner portion 22a' is formed closer to a corner at which the first side m1 and the second side m2 intersect. The corner portion 22b is formed closer to a corner at which the third side m3 and the fourth side m4 intersect. The corner portion 22b' is formed closer to a corner at which the second side m2 and the third side m3 intersect.

A creepage distance D1a is a creepage distance for the corner portion 22a on the first side m1. In the present example, the corner portion 22a and the corner portion 22a' have the same creepage distance. The creepage distance D1a not only refers to a distance when the distance between the edge of the first metal board 20 and the edge of the insulating substrate 10 becomes exactly the smallest, but also includes a region up to 10% greater in length than the smallest distance between the edge of the first metal board 20 and the edge of the insulating substrate 10. That is, the corner portion 22 includes, in addition to portions for which the creepage distance is the smallest, portions for which the creepage distance is 10% greater than the smallest distance in length.

The center portion 24 is, on at least one side of the first metal board 20, positioned closer to a center of the first metal board 20 than the corner portion 22 is. The center portion 24 is a portion for which the creepage distance is greater than the creepage distance for the corner portion 22. That is, the center portion 24 represents a region other than the corner portion 22.

A creepage distance D1b refers to a distance between the edge of the center portion 24 and the edge of the insulating substrate 10. The creepage distance D1b is greater than the creepage distance D1a. In the substrate 100 for semiconductor devices, the creepage distance D1b for the center portion 24 is greater, which suppresses overflow of the solder 40 from the insulating substrate 10. For example, the creepage distance D1b for the center portion 24 is 1.5 times or more and 2.5 times or less the creepage distance D1a for the corner portion 22.

A range La of the corner portion 22 refers to a range of a region which corresponds to the corner portion 22, on a side of the insulating substrate 10 corresponding to the corner portion 22. For example, as an exemplary range La of the corner portion 22, ranges L1a, L1a', L2a, L2a' are illustrated.

The range L1a is a range of the corner portion 22a on the first side m1. The range L1a' is a range of the corner portion 22a' on the first side m1. Also, the range L2a is a range of the corner portion 22a' on the second side m2. The range L2a' is a range of the corner portion 22b' on the second side m2. In the first metal board 20 of the present example, all of the ranges of the corner portions 22 are equal. That is, all of the range L1a, the range L1a', the range L2a and the range L2a' are equal. In other words, the first metal board 20 of the present example has a symmetric structure.

A range Lb of the center portion 24 refers to a range of a region corresponding to the center portion 24, on a side of the insulating substrate 10 corresponding to the center portion 24. For example, as an exemplary range Lb of the center portion 24, ranges L1b and L2b are illustrated.

The range L1b refers to a range of the center portion 24 on the first side m1. The range L2b refers to a range of the center portion 24 on the second side m2. The range L1b is larger than the range L2b. In one example, the ratio of the range L1b to the range L2b is equal to the ratio of the first side m1 to the second side m2. The range L1b of the present example is larger than the range L1a. The range L1b may be larger than any ranges of the corner portions 22. For example, the range L1b is 1.3 times or more the range L1a.

Preferably, the range La of the corner portion 22 is, on at least one side of the first metal board 20, 30% or less of the shortest side of the first metal board 20 in length. This can suppress the solder overflow from the center portion 24. Also, preferably, the range La of the corner portion 22 is, on the shortest side of the first metal board 20, 10% or more of the shortest side of the first metal board 20 in length. This results in the margin against crack growth from the corner portion 22 of the first metal board 20, which can suppress decrease in the heat cycle reliability.

Figure 3:
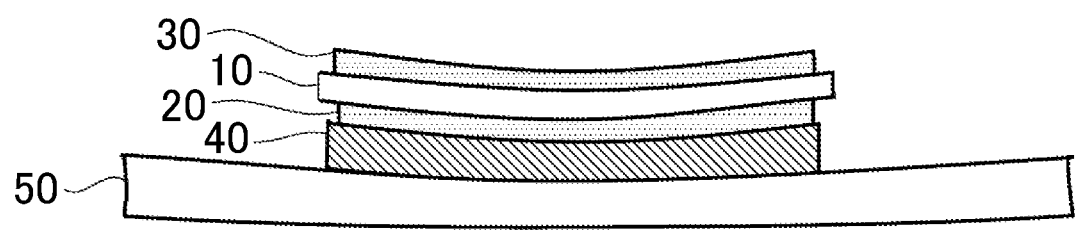
FIG. 3 illustrates an exemplary configuration of the substrate 100 for semiconductor devices.

FIG. 3 illustrates an exemplary configuration of the substrate 100 for semiconductor devices. In the substrate 100 for semiconductor devices of the present example, the second metal board 30 has a smaller volume than the first metal board 20. The substrate 100 for semiconductor devices deforms to have a downwardly convex shape due to a heat stress after joint with the solder 40. The substrate 100 for semiconductor devices can suppress voids to be generated between the first metal board 20 and the heat releasing board 50, if it is designed to have a downwardly convex shape. If a heat stress is generated to deform the substrate 100 for semiconductor devices to be downwardly convex, the solder 40 around the center of the substrate 100 for semiconductor devices is easily pushed out.

Comparative Example 1

Figure 4:
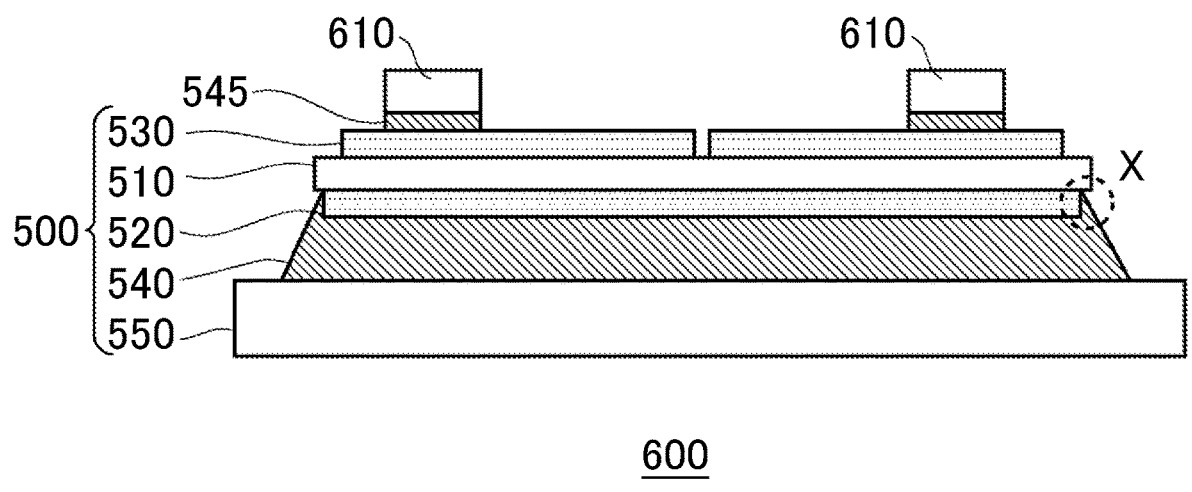
FIG. 4 illustrates an exemplary configuration of a semiconductor device 600 in accordance with Comparative Example 1.

FIG. 4 illustrates an exemplary configuration of a semiconductor device 600 in accordance with Comparative Example 1. The semiconductor device 600 of the present example comprises a substrate 500 for semiconductor devices and a semiconductor chip 610. The substrate 500 for semiconductor devices includes an insulating substrate 510, a first metal board 520, a second metal board 530, a solder 540 and a heat releasing board 550. The semiconductor chip 610 is joined above the substrate 500 for semiconductor devices via the solder 545.

The first metal board 520 is formed to have an approximately constant creepage distance on each side. The creepage distance of the first metal board 520 is shorter than the creepage distance of the second metal board 530. Therefore, the substrate 500 for semiconductor devices of the present example allows the solder 540 to easily overflow. In particular, the solder 540 includes a region X with the solder 540 raised at the edge of the semiconductor device 600.

In the semiconductor device 600, the raised solder 540 causes the insulation distance to be reduced. This results in the semiconductor device 600 having reduced insulation properties, which causes the reduced reliability and yield rate.

Figure 5A:
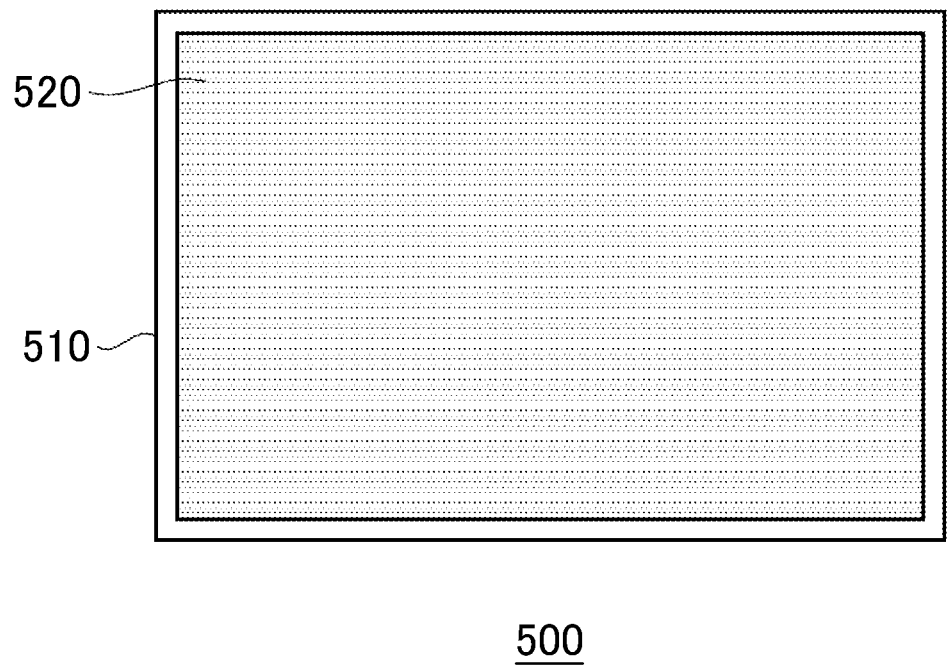
FIG. 5A illustrates an exemplary plan view of a substrate 500 for semiconductor devices in accordance with Comparative Example 1.
Figure 5B:
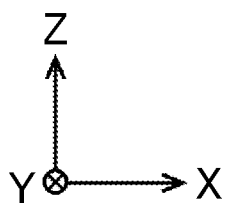
FIG. 5B illustrates an exemplary cross-sectional view of the substrate 500 for semiconductor devices in accordance with Comparative Example 1.
Figure 5B:
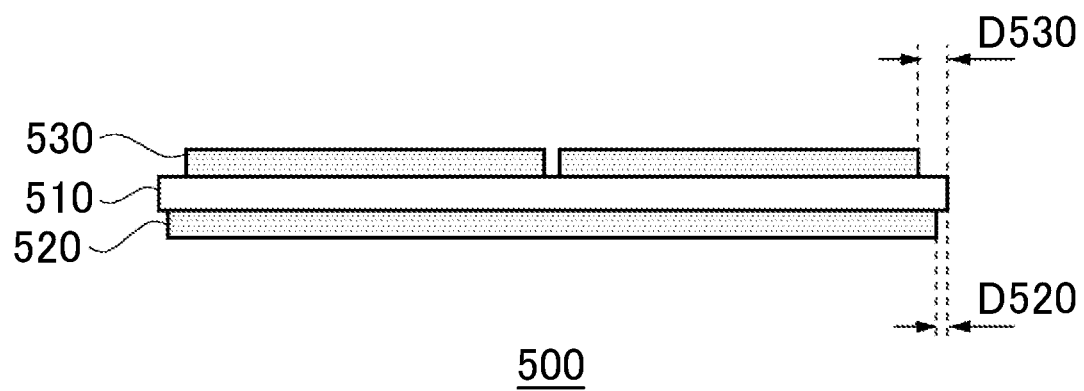

FIG. 5A illustrates an exemplary plan view of a substrate 500 for semiconductor devices in accordance with Comparative Example 1. FIG. 5B illustrates an exemplary cross-sectional view of the substrate 500 for semiconductor devices in accordance with Comparative Example 1. The substrate 500 for semiconductor devices of the present example comprises an insulating substrate 510 and a first metal board 520 which have a rectangular shape in a planar view.

A creepage distance D520 refers to a distance between an edge of the first metal board 520 and an edge of the insulating substrate 510. The creepage distance D520 is constant on each side.

A creepage distance D530 refers to a distance between an edge of the second metal board 530 and an edge of the insulating substrate 510. The creepage distance D520 is shorter than the creepage distance D530. That is, when the first metal board 520 and the heat releasing board 55 are joined by means of a solder, the substrate 500 for semiconductor devices is curved due to a stress to cause the solder to be wetting and spreading, which results in the solder 540 easily overflowing from the insulating substrate 510.

Example 2

Figure 6:
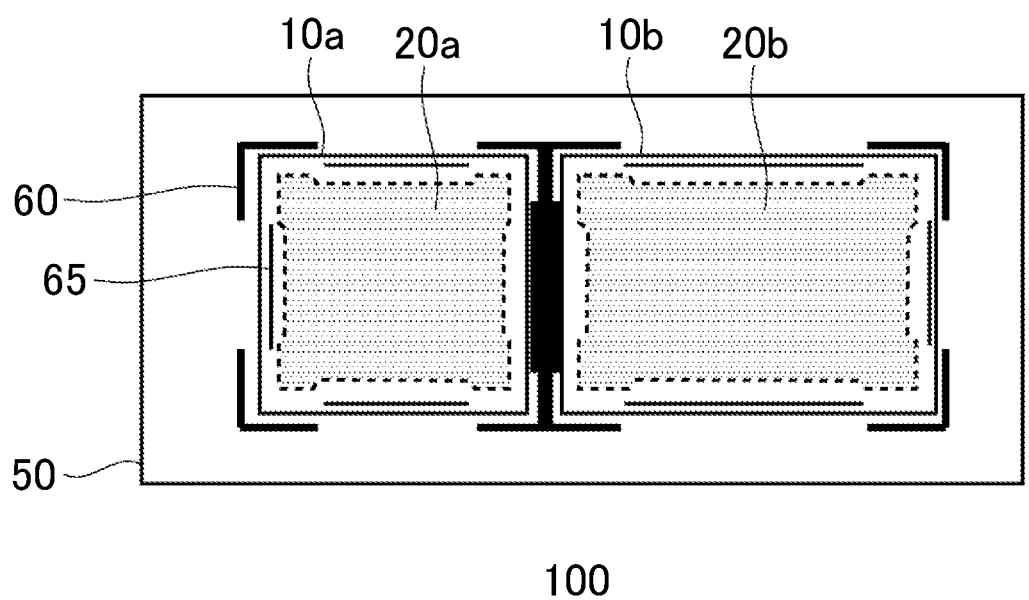
FIG. 6 illustrates an exemplary configuration of a substrate 100 for semiconductor devices in accordance with Example 2.

FIG. 6 illustrates an exemplary configuration of a substrate 100 for semiconductor devices in accordance with Example 2. For the substrate 100 for semiconductor devices of the present example, insulating substrates 10a, 10b, first metal boards 20a, 20b and a heat releasing board 50 are shown. Other configurations are omitted for the sake of simplicity of the description.

The insulating substrate 10a has an approximately square shape in a planar view. The insulating substrate 10b has an approximately rectangular shape in a planar view. In one example, the insulating substrate 10a and the insulating substrate 10b include a semiconductor chip 110 formed thereon, respectively.

The heat releasing board 50 has a rectangular shape in a planar view. The heat releasing board 50 is sized to allow at least the insulating substrate 10a and the insulating substrate 10b to be placed thereon. The heat releasing board 50 of the present example includes soldered portions 60, 65.

The first metal board 20a is provided to correspond to the insulating substrate 10a.

The first metal board 20a has an approximately square shape if the insulating substrate 10a has a square shape. The first metal board 20a of the present example includes a corner portion 22 and a center portion 24 on each side.

The first metal board 20b is provided to correspond to the insulating substrate 10b. The first metal board 20b has an approximately rectangular shape if the insulating substrate 10b has a rectangular shape. The first metal board 20b of the present example includes a corner portion 22 and a center portion 24 on each side.

The soldered portions 60, 65 are formed in a surrounding area of the insulating substrate 10 to prevent the solder 40 from flowing out when melted. At least portions of the soldered portions 60, 65 are formed below the insulating substrate 10 in a planar view. That is, at least portions of the soldered portions 60, 65 may be formed inside of the insulating substrate 10 in a planar view. Also, the soldered portion 60 of the present example is formed not sequentially with the soldered portion 65.

Here, if the soldered portions 60, 65 are formed inside of the insulating substrate 10, the solder 40 is prevented from overflowing from below the insulating substrate 10. For example, the soldered portions 60, 65 are an organic resist or a carbon scribe formed on the heat releasing board 50. The organic resist is formed in a predetermined pattern on the heat releasing board 50, which prevents the solder 40 from diffusing beyond the organic resist. Also, the carbon scribe is a concave portion formed on a surface of the heat releasing board 50. This results in the carbon scribe suppressing the solder 40 diffusing beyond the carbon scribe. In one example, the carbon scribe is formed by scribing the surface of the heat releasing board 50 with a pencil or the like.

The soldered portion 60 is provided to correspond to the corner portion 22. Being provided to correspond to the corner portion 22 refers to being provided opposing to a side of the edge of the corner portion 22. The soldered portion 60 of the present example is an organic resist. Although the soldered portion 60 of the present example is formed outside of the insulating substrate 10, it may also be formed inside of the insulating substrate 10.

The soldered portion 65 is provided to correspond to the center portion 24. Being provided to correspond to the center portion 24 refers to being provided opposing to a side of the edge of the center portion 24. As the soldered portion 65 corresponds to the center portion 24 formed inside of the insulating substrate 10 in a planar view, it can be formed inside of the insulating substrate 10. The soldered portion 65 of the present example is formed more inside of the insulating substrate 10 than the soldered portion 60 in a planar view. The soldered portion 65 of the present example is a carbon scribe.

Comparative Example 2

Figure 7:
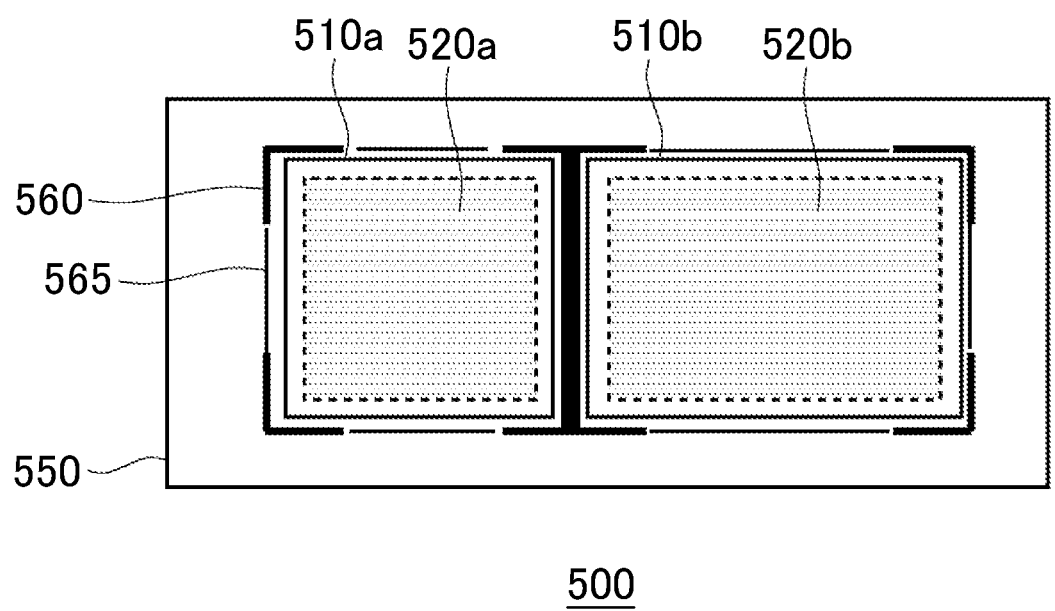
FIG. 7 illustrates an exemplary substrate 500 for semiconductor devices in accordance with Comparative Example 2.

FIG. 7 illustrates an exemplary substrate 500 for semiconductor devices in accordance with Comparative Example 2. For the substrate 500 for semiconductor devices of the present example, insulating substrates 510a, 510b, first metal boards 520a, 520b and a heat releasing board 550 are shown. Other configurations are omitted for the sake of simplicity of the description. The heat releasing board 550 includes a soldered portion 560 and a soldered portion 565 formed thereon.

The first metal board 520a is provided to correspond to the insulating substrate 510a. The first metal board 520a has a square shape if the insulating substrate 510a has a square shape. The first metal board 520a is formed inside of the insulating substrate 510a in a planar view. The first metal board 520a is formed to have an approximately constant creepage distance on each side.

The first metal board 520b is provided to correspond to the insulating substrate 510b. The first metal board 520b has a rectangular shape if the insulating substrate 510b has a rectangular shape. The first metal board 520b is formed inside of the insulating substrate 510b in a planar view. The first metal board 520b is formed to have an approximately constant creepage distance on each side.

The soldered portion 560 and the soldered portion 565 are formed to cover an outer peripheral portion of the insulating substrate 510a and an outer peripheral portion of the insulating substrate 510b. The soldered portion 560 is formed sequentially with the soldered portion 565.

If a heat stress is applied to the substrate 500 for semiconductor devices of the present example, the solder 540 may overflow from below the insulating substrate 510. Also, particularly in a region in which the insulating substrate 510a and the insulating substrate 510b are opposing to each other, the overflow volume of the solder 540 may increase and reduce the reliability.

Also, in the semiconductor device 600, the soldered portion 560 and the soldered portion 565 need to be provided in a region outside of the insulating substrate 510 in a planar view to form solder fillets. The solder fillet refers to one having a shape spreading toward the bottom after soldered. Also, misalignment may occur when assembled.

On the other hand, if the area of the semiconductor device 600 is simply reduced to increase a creepage distance in length, the joint area of the solder 540 is reduced, thereby reducing the margin against the solder crack growth due to a heat stress. This reduces the heat cycle resistance of the semiconductor device 600.

Example 3

Figure 8:
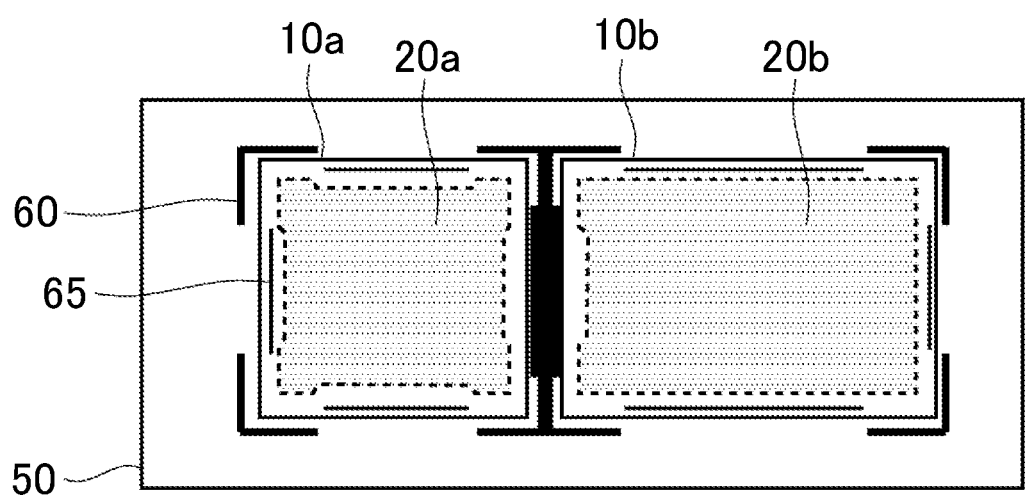
FIG. 8 illustrates an exemplary configuration of a substrate 100 for semiconductor devices in accordance with Example 3.

FIG. 8 illustrates an exemplary configuration of a substrate 100 for semiconductor devices in accordance with Example 3. The substrate 100 for semiconductor devices of the present example comprises a first metal board 20b of a shape different from that of the substrate 100 for semiconductor devices in accordance with Example 2.

The first metal board 20a is provided to correspond to the insulating substrate 10a. The first metal board 20a has an approximately square shape if the insulating substrate 10a has a square shape. The first metal board 20*a* of the present example includes a corner portion 22 and a center portion 24 on each side.

The first metal board 20*b* is provided to correspond to the insulating substrate 10*b*. The first metal board 20*b* has an approximately rectangular shape if the insulating substrate 10*b* has a rectangular shape. The first metal board 20*b* of the present example includes a side having the corner portion 22 and the center portion 24 formed thereon and a side not having the corner portion 22 or the center portion 24 formed thereon.

The first metal boards 20*a*, 20*b* include an inner side around which the first metal board 20*a* and the first metal board 20*b* are opposing to each other and an outer side around which the first metal board 20*a* and the first metal board 20*b* are not opposing to each other.

On the inner side, the first metal board 20*a* includes the corner portion 22 and the center portion 24. Also, on the inner side, the first metal board 20*b* includes the corner portion 22 and the center portion 24.

On the outer side, the first metal board 20*a* includes the corner portion 22 and the center portion 24. The first metal board 20*a* of the present example includes, on all of three outer sides, the corner portion 22 and the center portion 24. Also, on the outer side, the first metal board 20*b* at least includes a side parallel to the insulating substrate 10. In one example, the first metal board 20*b* includes, on three outer sides, a side parallel to the insulating substrate 10, respectively. Also, the first metal board 20*b* may be formed to include the outer side parallel to a longer side of the heat releasing board 50.

Here, in a longitudinal direction of the first metal board 20*b*, the solder 40 is not easily affected by the heat stress. This allows the first metal board 20*b* of the present example to omit the center portion 24 in the longer side direction of the first metal board 20*b*. This results in the substrate 100 for semiconductor devices of the present example preventing crack growth while suppressing overflow of the solder 40 from the inner side.

Figure 9:
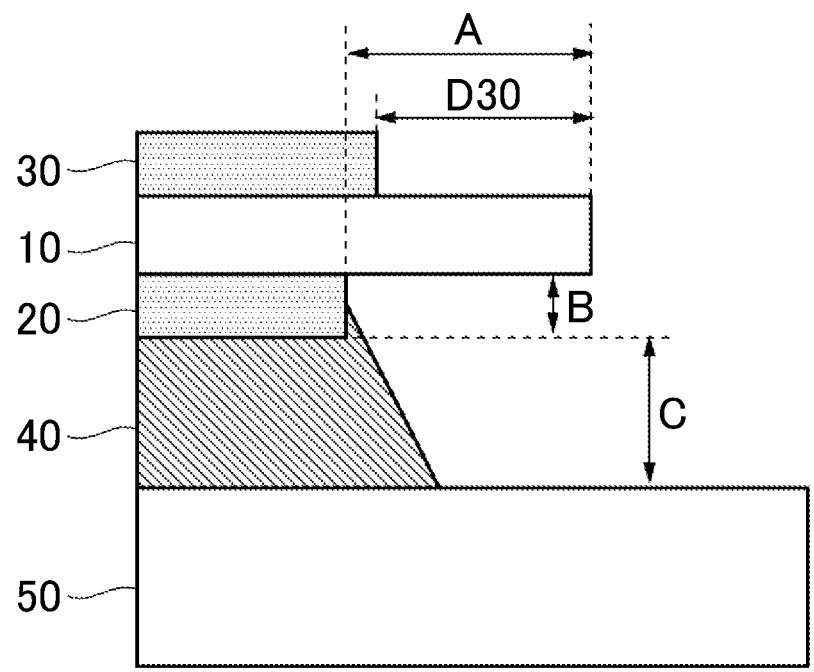
FIG. 9 illustrates an exemplary expanded view of an edge of the substrate 100 for semiconductor devices at a positive side of the X axis.

FIG. 9 illustrates an exemplary expanded view of an edge of the substrate 100 for semiconductor devices at a positive side of the X axis. In the present example, described is an exemplary design method of the substrate 100 for semiconductor devices.

A creepage distance A refers to a distance between the edge of the insulating substrate 10 and the edge of the first metal board 20. That is, the creepage distance A is a creepage distance for the first metal board 20. The creepage distance A may be designed to be greater than the creepage distance for the second metal board 30. The creepage distance A may be, as illustrated in FIG. 2A, FIG. 2B, and FIG. 2C, greater than a distance (D30) between the edge of the insulating substrate 10 and the edge of the second metal board 30 at the center portion 24, and equal to or smaller than D30 at the corner portion 22.

A thickness B refers to a thickness of the first metal board 20. The thickness B of the present example is equal to a thickness of the second metal board 30. In one example, the creepage distance A and the thickness B are designed such that the volume of the first metal board 20 is greater than the volume of the second metal board 30.

A thickness C refers to a thickness of the solder 40. The thickness C is defined as a distance between a lower end of the first metal board 20 and an upper end of the heat releasing board 50. The thickness C is determined by a material of the solder 40, a joint temperature of the solder 40 and others.

The substrate 100 for semiconductor devices of the present example is designed such that the creepage distance A is equal to or greater than the sum of the thickness B and the thickness C. That is, the creepage distance A is determined to fulfill the following condition. (Creepage distance A)≥ (thickness B of the first metal board 20)+(thickness C of the solder 40) In other words, the creepage distance A is equal to or greater than the distance between the lower end of the insulating substrate 10 and the upper end of the heat releasing board 50. This results in the substrate 100 for semiconductor devices ensuring sufficient insulation properties even if the solder 40 overflows and is raised.

As described above, the substrate 100 for semiconductor devices described herein has a sufficient creepage distance for the center portion 24 of the first metal board 20, which can suppress insulation breakdown along the insulating substrate 10. Also, the substrate 100 for semiconductor devices described herein has a shorter creepage distance for the corner portion 22 of the first metal board 20 than the center portion 24, which provides the margin against the crack growth and high heat cycle reliability. Thus, the substrate 100 for semiconductor devices described herein is of high quality and a good yield rate.

Figure 10:
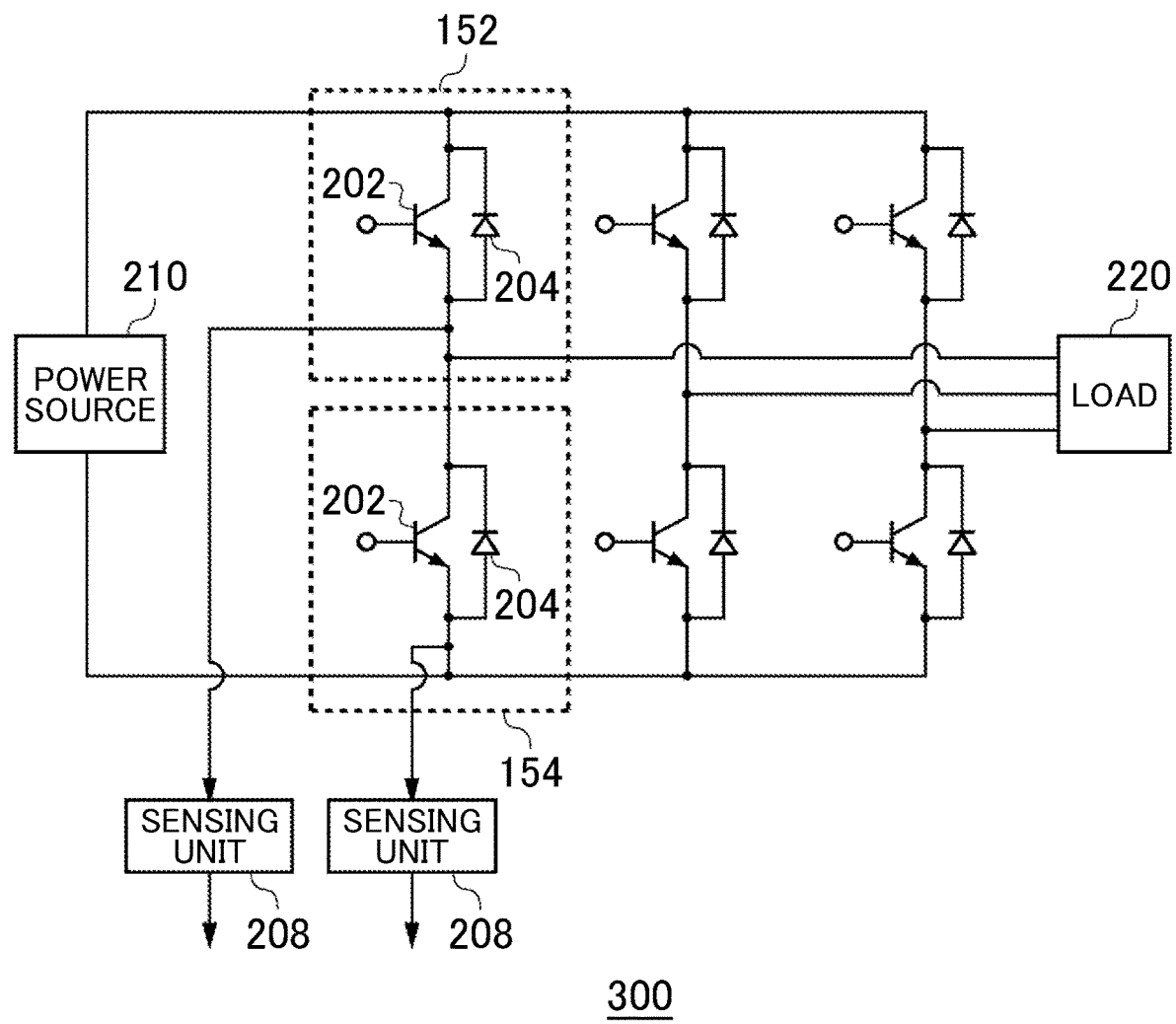
FIG. 10 illustrates an exemplary configuration of a circuit 300 including the semiconductor device 200.

FIG. 10 illustrates an exemplary configuration of a circuit 300 including the semiconductor device 200. The circuit 300 of the present example is a three phase inverter circuit provided between a power source 210 and a load 220. The load 220 is, for example, a third phase motor. The circuit 300 converts power supplied from the power source 210 into three phase signals (AC voltage) and supplies the converted signals to the load 220.

The circuit 300 comprises three bridges corresponding to three phase signals. Each bridge includes an upper arm 152 and a lower arm 154 provided in series between a positive side wire and a negative side wire. Each arm is provided with a transistor 202 such as an IGBT and a diode 204 such as an FWD. The arm may be provided with an individual semiconductor chip as the transistor 202 and the diode 204, or may be provided with a semiconductor chip on which an RC-IGBT having both features is formed. Signals of each phase are output from a connection point of the upper arm 152 and the lower arm 154.

Also, the circuit 300 comprises two sensing units 208. One sensing unit 208 detects an electric current at the connection point of the upper arm 152 and the lower arm 154. The other sensing unit 208 detects an electric current at the connection point of the lower arm 154 and the reference potential.

In the present example, the semiconductor device 200 includes a pair of the upper arm 152 and the lower arm 154. That is, the circuit 300 is configured by comprising three semiconductor devices 200 each including a pair of the upper arm 152 and the lower arm 154. Also, the semiconductor device 200 may include the sensing unit 208. In one example, the semiconductor device 200 may include all of the upper arms 152 and the lower arms 154 of the circuit 300.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: insulating substrate, 20: first metal board, 22: corner portion, 24: center portion, 30: second metal board, 40: solder, 45: solder, 50: heat releasing board, 60: soldered portion, 65: soldered portion, 100: substrate for semiconductor devices, 110: semiconductor chip, 152: upper arm, 154: lower arm, 200: semiconductor device, 202: transistor, 204: diode, 208: sensing unit, 210: power source, 220: load, 300: circuit, 500: substrate for semiconductor devices, 510: insulating substrate, 520: first metal board, 530: second metal board, 540: solder; 545: solder, 550: heat releasing board, 560: soldered portion, 565: soldered portion, 600: semiconductor device, 610: semiconductor chip

What is claimed is:

1. A substrate for semiconductor devices comprising:
an insulating substrate; and
a first metal board having a plurality of sides and formed on a first surface of the insulating substrate;
wherein the first metal board includes:
a corner portion positioned closer to a corner of a first side of the plurality of sides of the first metal board, for which a creepage distance between a first edge of a plurality of edges of the first metal board and a first edge of a plurality of edges of the insulating substrate reaches a smallest value for the first side of the first metal board; and
a center portion positioned closer to a center of the first side than the corner portion, for which a creepage distance between the first edge of the first metal board and the first edge of the insulating substrate exceeds the smallest value;
wherein a range of the center portion is larger than a range of the corner portion,
a center soldered portion corresponding to the center portion is a carbon scribe formed on a surface of a heat releasing board, and
a corner soldered portion corresponding to the corner portion is an organic resist formed on the surface of the heat releasing board.

2. The substrate for semiconductor devices according to claim 1 further comprising:
a second metal board formed on a second surface opposite to the first surface of the insulating substrate;
wherein the second metal board has a smaller volume than the first metal board.

3. The substrate for semiconductor devices according to claim 2, wherein the second metal board has a same film thickness as that of the first metal board.

4. The substrate for semiconductor devices according to claim 1, wherein the range of the center portion is 1.3 times or more the range of the corner portion.

5. The substrate for semiconductor devices according to claim 1, wherein the range of the corner portion is 30% or less of a shortest one of the plurality of edges of the first metal board in length.

6. The substrate for semiconductor devices according to claim 1, wherein the range of the corner portion is 10% or more of a shortest side of the first metal board in length.

7. The substrate for semiconductor devices according to claim 1, wherein
the first metal board has a rectangular shape, and
the center portion of a longer one of the plurality of edges of the first metal board is larger than the center portion of a shorter one of the plurality of edges of the first metal board.

8. The substrate for semiconductor devices according to claim 7, wherein the range of the corner portion on the longer one of the plurality of edges of the first metal board is equal to the range of the corner portion on the shorter one of the plurality of edges of the first metal board.

9. The substrate for semiconductor devices according to claim 1, wherein the creepage distance for the center portion is 1.5 times or more and 2.5 times or less the creepage distance for the corner portion.

10. The substrate for semiconductor devices according to claim 1 further comprising:
another insulating substrate; and
a second metal board arranged to correspond to the second insulating substrate;
wherein the heat releasing board has a rectangular shape on which the insulating substrate and the another insulating substrate are placed via the first metal board and the second metal board.

11. The substrate for semiconductor devices according to claim 10, wherein the first metal board and the second metal board each include:
an inner edge around which the first metal board opposes the second metal board; and
an outer edge around which the first metal board is not opposing to the second metal board, the outer edge being formed to be parallel to a longer edge of the heat releasing board.

12. The substrate for semiconductor devices according to claim 11, wherein the corner portion and the center portion correspond to the inner edge of the first metal board and the inner edge of the second metal board.

13. The substrate for semiconductor devices according to claim 10 wherein at least a portion of at least one of the center soldered portion and the corner soldered portion is formed below the insulating substrate in a planar view.

14. The substrate for semiconductor devices according to claim 13, wherein the center soldered portion is formed more inside of the first metal board than the corner soldered portion.

15. The substrate for semiconductor devices according to claim 13, wherein the center soldered portion is formed not sequentially with the corner soldered portion.

16. The substrate for semiconductor devices according to claim 13, wherein the center soldered portion is a carbon scribe or an organic resist formed on the surface of the heat releasing board.

17. A substrate for semiconductor devices comprising:
an insulating substrate and another insulating substrate; and
a first metal board having a plurality of sides and formed on a first surface of the insulating substrate;
a second metal board having a plurality of sides and formed on a first surface of the another insulating substrate;

a heat releasing board having a rectangular shape on which the insulating substrate and the another insulating substrate are placed via the first metal board and the second metal board, wherein the first metal board includes:

a corner portion positioned closer to a corner of a first side of the plurality of sides of the first metal board, for which a creepage distance between a first edge of a plurality of edges of the first metal board and a first edge of a plurality of edges of the insulating substrate reaches a smallest value for the first side of the first metal board; and a center portion positioned closer to a center of the first side than the corner portion, for which a creepage distance between the first edge of the first metal board and the first edge of the insulating substrate exceeds the smallest value; wherein a range of the center portion is larger than a range of the corner portion, a center soldered portion corresponding to the center portion is a carbon scribe formed on a surface of the heat releasing board, a corner soldered portion corresponding to the corner portion is an organic resist formed on the surface of the heat releasing board, and at least a portion of at least one of the center soldered portion and the corner soldered portion is formed below the insulating substrate in a planar view.

\* \* \* \* \*